US00RE38166E

(19) United States
(12) Reissued Patent
Calligaro et al.

(10) Patent Number: US RE38,166 E
(45) Date of Reissued Patent: Jul. 1, 2003

(54) CIRCUIT AND METHOD FOR READING A MEMORY CELL THAT CAN STORE MULTIPLE BITS OF DATA

(75) Inventors: Cristiano Calligaro, Torre d'Isola (IT); Vincenzo Daniele, Brugherio (IT); Roberto Gastaldi, Agrate Brianza (IT); Alessandro Manstretta, Broni (IT); Nicola Telecco, Monleale (IT); Guido Torelli, S. Alessio Con Vialone (IT)

(73) Assignee: STMicroelectronics, SRL, Agrate Brianza (IT)

(21) Appl. No.: 09/410,164

(22) Filed: Sep. 30, 1999

Related U.S. Patent Documents

Reissue of:
(64) Patent No.: 5,673,221
Issued: Sep. 30, 1997
Appl. No.: 08/592,939
Filed: Jan. 29, 1996

(30) Foreign Application Priority Data

Mar. 23, 1995 (EP) ..... 95830110

(51) Int. Cl.[7] ..... G11C 11/56
(52) U.S. Cl. ..... 365/168; 365/185.03; 365/207
(58) Field of Search ..... 365/168, 185.03, 365/207, 208, 185.21, 185.22

(56) References Cited

U.S. PATENT DOCUMENTS 4,809,224 A * 2/1989 Suzuki et al. ..... 365/168
4,964,079 A 10/1990 Devin ..... 365/168
5,012,448 A 4/1991 Matsuoka et al. ..... 365/208

OTHER PUBLICATIONS

Bauer, M. et al., "A Multilevel–Cell 32 Mb Flash Memory," *Digest of Technical Papers*, IEEE Solid–State Circuits Conference, Feb. 16, 1995, pp. 119, 132–133, 351.
"Mid–Level Current Generation Circuit," *IBM® Technical Disclosure Bulletin 33* (1B):386–388, Jun. 1990.

* cited by examiner

*Primary Examiner*—Tan T. Nguyen
(74) *Attorney, Agent, or Firm*—David V. Carlson; Lisa K. Jorgenson

(57) ABSTRACT

A sensing circuit for serial dichotomic sensing of multiple-level memory cells which can take one programming level among a plurality of $m=2^n$ ($n>=2$) different programming levels, comprises biasing means for biasing a memory cell to be sensed in a predetermined condition, so that the memory cell sinks a cell current with a value belonging to a plurality of m distinct cell current values, each cell current value corresponding to one of the programming levels, a current comparator for comparing the cell current with a reference current generated by a variable reference current generator, and a successive approximation register supplied with an output signal of the current comparator and controlling the variable reference current generator. The variable reference current generator comprises an offset current generator permanently coupled to the current comparator, and m–2 distinct current generators, independently activatable by the successive approximation register, each one generating a current equal to a respective one of the plurality of cell current values.

41 Claims, 4 Drawing Sheets

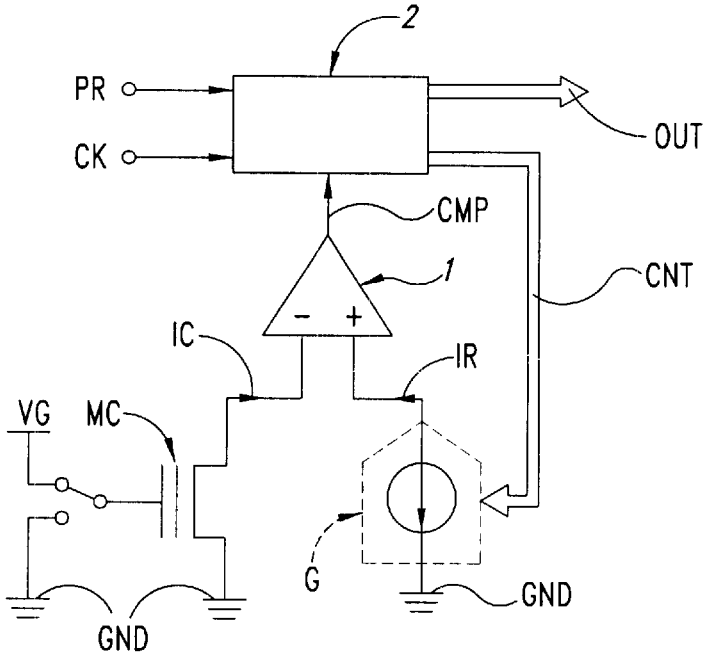
Fig. 5
(AMENDED)

| CMP | tn Q1 | tn Q0 | tn+1 Q1 | tn+1 Q0 | OUT1 | OUT0 |
|---|---|---|---|---|---|---|
| 0 | 0 | 1 | 1 | 0 | X | X |
| 1 | 0 | 1 | 0 | 0 | X | X |
| 0 | 1 | 0 | 0 | 1 | 1 | 1 |
| 1 | 1 | 0 | 0 | 1 | 1 | 0 |
| 0 | 0 | 0 | 0 | 1 | 0 | 1 |
| 1 | 0 | 0 | 0 | 1 | 0 | 0 |

CIRCUIT AND METHOD FOR READING A MEMORY CELL THAT CAN STORE MULTIPLE BITS OF DATA

Matter enclosed in heavy brackets [ ] appears in the original patent but forms no part of this reissue specification; matter printed in italics indicates the additions made by reissue.

CROSS-REFERENCE TO RELATED APPLICATION

The following pending U.S. Patent Application by Cristiano Calligaro, Vincenzo Daniele, Roberto Gastaldi, Alessandro Manstretta, Nicola Telecco and Guido Torelli entitled: "Serial Dichotomic Method For Sensing Multiple-Level Non-Volatile Memory Cells, And Sensing Circuit Implementing Such Method," Ser. No. 08/593,650 (Attorney's Docket No. 853063.420), which has the same effective filing date and ownership as the present application, and to that extent is related to the present application, and which is incorporated herein by reference.

TECHNICAL FIELD

The present invention relates to a sensing circuit for serial dichotomic sensing of multiple-levels non-volatile memory cells.

BACKGROUND OF THE INVENTION

The market demand for non-volatile memories with higher and higher storage capacity is forcing the semiconductor manufacturers to a continuous effort in scaling the devices and in increasing the chip size.

As an additional possibility to increase the memories' capacities, it has been proposed to store more than one bit per memory cell: a memory device with memory cells capable of storing two or even four bits has a storage capacity two or, respectively, four times higher than that of a memory device with the same chip size but with memory cells capable of storing only one bit each.

Non-volatile memory cells (i.e., memory cells which retain their programming state even in the absence of power) are generally represented by MOS field-effect transistors; data can be programmed in non-volatile memory cells by changing the threshold voltage of the MOS field-effect transistors: in the case of ROMs this is done during their fabrication, while in the case of EPROMs, EEPROMs and Flash EEPROMs, the change in the threshold voltage is achieved by properly biasing the MOS field effect transistors to cause an injection of charges in a floating gate.

To determine the programming state of a non-volatile memory cell, i.e., to "read" or to "sense" the contents of the memory cell, a fixed voltage VG is applied to the control gate of the MOS transistor: the programming state of the memory cell can thus be determined by detecting the position of the threshold voltage of the MOS transistor with respect to said fixed gate voltage.

In the most common case of non-volatile memory cells that are capable of storing only one bit of information, a memory cell can show two different programming states (logic levels), corresponding to two different threshold voltage values; hereinafter, such a cell will be called a "two-level memory cell." The reading of the memory cells is performed by a so-called "sensing circuit," which delivers a voltage signal having two distinct possible values, corresponding to the two logic levels.

In the case of non-volatile memory cells that are capable of storing more than one bit of information, a memory cell must be able to show $m=2^n$ distinct programming states or levels, where n represents the number of bits which can be stored in the memory cell; in the following, such a cell will be called a "multiple-level memory cell." As in the case of two-level cells, each level corresponds to a different value for the threshold voltage of the MOS transistor.

The discrimination of the m different programming levels can be performed by means of a either a voltage-mode sensing technique or a current-mode sensing technique. In the latter case, for example, the allowed threshold voltage range of the memory cell is divided, on the basis of the electric and physical characteristics of the memory cells, into m sub-intervals, each corresponding to one of the different m levels to be discriminated. The memory cell is then programmed in a desired one of the m different levels by properly adjusting its threshold voltage, so that when the memory cell is biased in the prescribed sensing conditions, it sinks a current corresponding to the desired programming level.

Two sensing techniques have been proposed for multiple-level memory cells: parallel-mode sensing and serial-mode sensing.

Parallel-mode sensing is for example described in A. Bleiker, H. Melchior, "A Four-State EEPROM Using Floating-Gate Memory Cells," IEEE Journal of Solid State Circuits, vol. SC-22, No. 3, July 1987, pp. 460–463. This technique is the natural extension of the conventional technique used for two-level memory cells, and provides for generating m−1 distinct predetermined references (current references for the current-mode approach, or voltage references for the voltage-mode approach), and for performing m−1 simultaneous comparisons of such m−1 distinct voltage or current references with a current (or a voltage) derived from the memory cell to be read.

The advantages of the parallel-mode sensing technique are its high speed and the independence of the sensing time from the programming state of the memory cell; a disadvantage is the large area required by the sensing circuit, since m−1 distinct comparison circuits are necessary to perform the m−1 simultaneous comparisons.

Differently from parallel-mode sensing serial-mode sensing requires just one reference (current or voltage), which can be varied according to a prescribed law. This single reference is used to perform a series of successive comparisons, and is varied to approximate the analog current or voltage derived from the memory cell to be read. A serial-mode sensing circuit is simple to implement, and requires only a small area.

Two different kinds of serial-mode sensing methodologies are known, which differ in the law according to which the reference is made to vary.

The first methodology, also called "sequential," described for example in M. Horiguchi et at., "An Experimental Large-Capacity Semiconductor File Memory Using 16-Levels/Cell Storage," IEEE Journal of Solid State Circuits, vol. SC-23, No. 1, February 1988, pp. 27–32, consists of a succession of comparisons (at most m−1 ) between a fixed quantity (voltage or current) and a variable quantity (voltage or current) which is sequentially varied starting from an initial value.

For example, the fixed quantity can be the current sunk by the memory cell to be read (subject to a prescribed biasing condition), while the variable quantity can be a current supplied by a digitally-driven generator. The (constant)

current sunk by the memory cell to be read is compared with a reference current which takes successively increasing (or decreasing) discrete values starting from a minimum (or maximum) value; said discrete values are ideally chosen in such a way as to fall between the different current values corresponding to the m programming levels of the memory cell, so that the result of a comparison is negative (or positive) as long as the reference current is lower (or higher) than the cell's current. The series of successive comparisons stops after the first positive (or negative) result; the last value of the reference current represents the current of the memory cell, except for a constant term associated with the position of the reference current value with respect to the programming levels of the memory cell.

It appears that the time required to read a memory cell with the serial sequential method is not uniform, but depends on the particular programming level of the memory cell and on the starting value of the reference voltage or current (the sensing time depends on the distance between the programming level of the cell to be read and the starting value of the reference voltage or current): from a minimum of one to a maximum of m−1 comparison steps are necessary to determine the programming state of an m-level memory cell. The sensing time soon becomes excessive with an increase in the number of bits stored in a single memory cell.

The second serial-mode sensing methodology, also called "dichotomic," is described in the co-pending European Patent Application No. 95830023.8 filed on January 27, 1995 in the name of the same applicant. This methodology consists of a successive approximations search that, starting from an initial value for the reference current, finds the value of the memory cell current after a succession of iterations. At each step of the iterative search, the (constant) memory cell current is compared with the variable reference current, whose value is chosen according to a dichotomic or "binary search" algorithm. The initial interval of possible memory cell current values is divided in two parts: depending on the result of the comparison, the successive dichotomy will be applied to only that part of the initial interval wherein the memory cell current falls; the iterative search is recursively repeated until the value of the memory cell current is determined.

Using the serial dichotomic method, the programming state of a memory cell with $m=2^n$ different programming levels is determined in n comparison steps, independently from the particular programing state of the memory cell.

In EPA 95830023.8, a sensing circuit suitable for actuating the serial dichotomic method is also described. The sensing circuit comprises a variable reference current generator controlled by a successive approximation register supplied with an output signal of a current comparator; the successive approximation register comprises a sequential network that, starting from a predetermined initial state, evolves through a succession of states, each one corresponding to one step of the serial dichotomic search.

The circuit implementation of the sensing circuit strongly depends on the structure of the variable reference current generator: this in fact affects the structure of the current comparator and of the successive approximation register.

According to the implementation described in EPA 905830023.8, the variable reference current generator comprises m−1 distinct current generators which are activated in a mutually exclusive way; each one of the m−1 current generator corresponds to one of m−1 values which can be taken by the reference current (absolute current generators technique).

In practice, each current generator is formed by a reference memory cell identical to the memory cell to be read. The reference memory cells are programmed in m−1 distinct states which, however, do not coincide with any of the m programming levels of the memory cells to be read, since the reference current values shall fall between the cell current values; in this case, the current comparator can be balanced (i.e., the currents to be compared are supplied to the inputs of the comparator in a 1:1 ratio).

Due to the fact that the reference memory cells are not programmed at the same levels as the memory cells to be read, there is not a perfect equivalence between the circuit branch containing the reference memory cells and the circuit branch containing the memory cell to be read. This means that there is a poor tracking between these two circuit branches with respect to process of biasing condition variations.

As an alternative, if the current comparator is properly unbalanced (i.e., if the currents to be compared are supplied to the inverting and non-inverting inputs of the comparator in a ratio equal to f different from 1, e.g., f=0.7) the reference memory cells can be programmed in m−1 distinct programming levels which coincide with the programming levels of the memory cell to be read.

Thanks to this, there is a substantially perfect equivalence between the circuit branch containing the memory cell to be read and the circuit branch containing the reference memory cell; also, every possible variation in process parameters or biasing conditions between the memory cell to be read and the reference memory cell is treated by the comparator as a common-mode contribution.

The drawbacks of having an unbalanced current comparator are that the values of the reference current do not fall exactly in the middle of each interval between successive memory cell current values; in fact, the ratio f causes a linear reduction of the current values. Moreover, in an unbalanced comparator, it is more critical to control the switching characteristics than it is in a balanced comparator.

SUMMARY OF THE INVENTION

In view of the state of the prior art described, it is an object of the present invention to provide a sensing circuit for the serial dichotomic sensing of multiple-level non-volatile memory cells that overcome the above-mentioned drawbacks.

According to the present invention, said object is achieved by means of a sensing circuit for the serial dichotomic sensing of multiple-level memory cells that can take one programming level among a plurality of $m=2^n$ ($n>=2$) different programming levels, comprising biasing means for biasing a memory cell to be sensed in a predetermined condition, so that the memory cell sinks a cell current with a value belonging to a plurality of m distinct cell current values, each cell current value corresponding to one of said programming levels, a current comparator for comparing the cell current with a reference current generated by a variable reference current generator, and a successive approximation register supplied with an output signal of the current comparator and controlling the variable reference current generator, characterized in that the variable reference current generator comprises an offset current generator permanently coupled to the current comparator, and m−2 distinct current generators, independently activatable by the successive approximation register, each one generating a current equal to a respective one of said plurality of cell current values.

In a sensing circuit according to the present invention, the reference current is given by the sum of an offset current plus a current equal to one of the possible values of the memory cell current. By properly adjusting the value of the offset current, it is possible to have reference current values which are exactly central between adjacent memory cell current values. This allows the use of a balanced current comparator, which is advantageous with respect to an unbalanced one.

BRIEF DESCRIPTION OF THE DRAWINGS

These and other features and advantages of the present invention will be made more evident by the following detailed description of some particular embodiments, described as non-limiting examples with reference to the annexed drawings, wherein:

FIG. 5 schematically shows a sensing circuit for sensing multiple-level non-volatile memory cells according to the present invention;

DETAILED DESCRIPTION OF THE INVENTION

Figure 1:
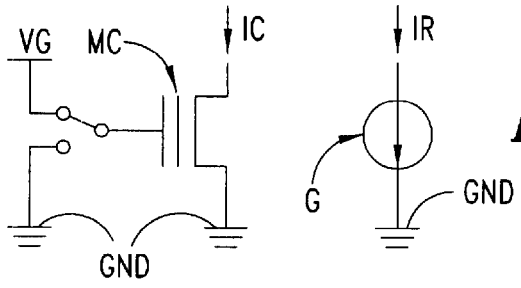
FIG. 1 schematically shows a multiple-level non-volatile memory cell under sensing conditions, and a reference current generator used to sense the memory cell according to a serial dichotomic sensing method.

First of all, the serial dichotomic sensing method will be described in the particular case of a four-level memory cell (a cell capable of storing two bits of information). A memory cell MC to be read is biased with a fixed, prescribed control gate voltage VG (FIG. 1). The memory cell MC shown in FIG. 1 is a floating-gate MOS field effect transistor, such as an EPROM, EEPROM or Flash EEPROM memory cell. Nevertheless, the memory cell could be a simple MOSFET with threshold voltage adjusted during fabrication, as in the case of a ROM memory cell. When the memory cell MC is biased with said fixed control gate voltage VG, it sinks a current IC whose value depends on the particular programming state of the memory cell itself, i.e., on the memory cell's threshold voltage. In FIG. 1, a current generator G is also shown supplying a reference current IR; IR is not constant, but can take values belonging to a discrete set, as will now be explained.

Figure 2:
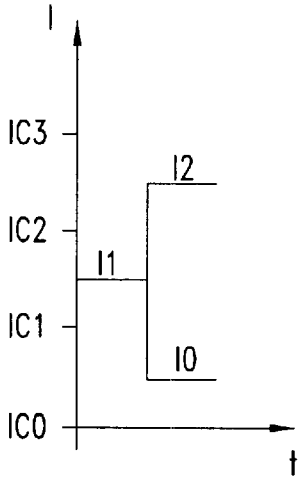
FIG. 2 diagrammatically shows the distribution of currents sunk by a four-level memory cell in its four different programming conditions, and the distribution of reference currents used to sense the memory cell according to the serial dichotomic sensing method.

In FIG. 2, four distinct values IC0–IC3 for the current IC are shown: each value corresponds to a respective one of the four different programming states of the memory cell MC (practical values can be, for example, IC0=0, IC1=30 uA IC2=60 uA and IC3-90 uA). FIG. 2 also shows, on the branches of a decision tree, the different values I0–I2 that can be taken by the reference current IR: by choosing the reference current values in such a way that they are central between successive values of IC, only three different reference current values I0–I2 are necessary (for example, I0=15 uA, I1=45 uA and I2=75 uA).

Figure 3:
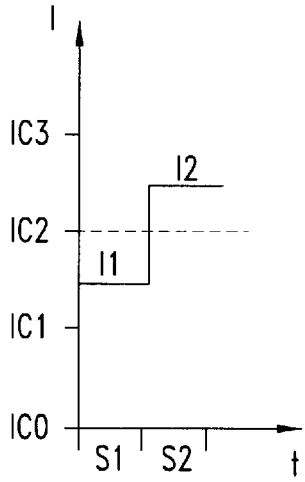
FIGS. 3 and 4 diagrammatically show the steps of the serial dichotomic sensing method for two different programming conditions of the memory cell.

Let's assume that the programming state of the memory cell MC corresponds to a current IC=IC2 (FIG. 3). The first step S1 of the sensing method provides for a comparison of the memory cell current IC with a reference current IR=I1, which is the central value in the set of values IC0–IC3; this is the best choice from the point of view of the efficiency of the method. The comparison tells that the cell current IC is higher than I1: a priori, it could be equal to IC2 or IC3. In the second step S2 the current IC is compared with a reference current IR=I2, which is the central value between IC2 and IC3, and it is found that IC is lower than I2: necessarily, IC must be equal to IC2. The programming condition of the memory cell MC has thus been determined in only two steps.

Figure 4:
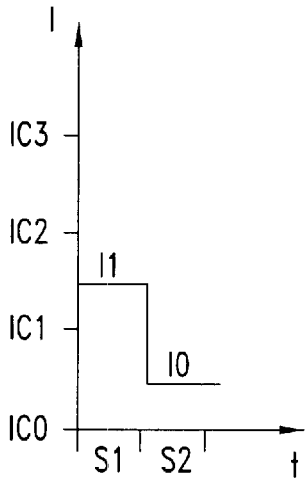

Let's now assume, as a second example, that the programming state of the memory cell MC corresponds to a current IC=IC0 (FIG. 4). In the first step S1 the cell current IC is again compared with the reference current IR=I1, to find that IC is lower than I1: this means that IC could be either IC0 or IC1. In the second step S2 the current IC is compared with a reference current IR=I0, which is the central value between IC0 and IC1: since the comparison tells that IC is lower than I0, IC must necessarily be equal to IC0. Again, the programming condition of the memory cell MC has been determined in two steps.

The number of steps required to determine the programming condition of the memory cell MC is uniform, i.e., it does not depend on the programming condition itself, and it is always equal to two in the example illustrated in FIGS. 2–4. It is straightforward to show that the programming condition of a sixteen-level memory cell is determined in four steps. In general, the serial dichotomic sensing method allows one to determine the programming condition of an m-level memory cell (with $m=2^n$) in n steps, independently from the programming condition of the memory cell.

FIG. 5 schematically shows a sensing circuit according to the present invention. The circuit substantially comprises a digitally-driven variable reference current generator G for generating a variable reference current IR, a current comparator 1 for comparing the reference current IR with a current IC sunk by a memory cell MC to be read, and a Successive Approximation Register ("SAR") 2.

The current comparator 1 has an inverting input connected to the drain electrode of a memory cell MC to be sensed, and a non-inverting input connected to the variable reference current generator G; the comparator 1 has an output signal CMP which is supplied to the SAR 2. The SAR 2 is further supplied with a preset signal PR and with a clock signal CK (timing signal), and supplies a group CNT of control signals (in digital format) to the variable reference current generator G; the SAR 2 also generates a group OUT of output signals carrying in digital format the programming state of the sensed memory cell MC.

Figure 6:
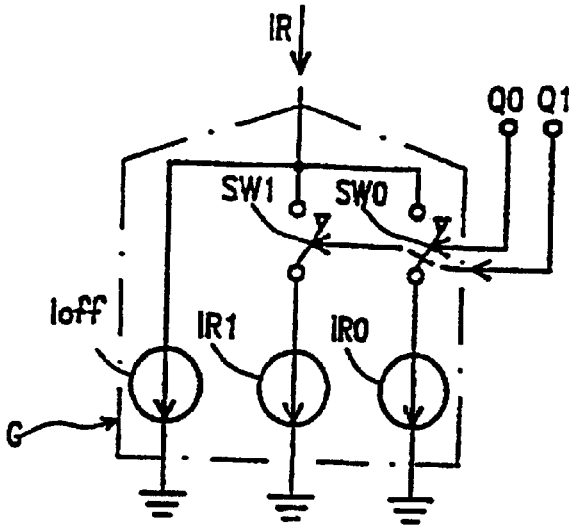
FIG. 6 schematically shows a variable reference current generator for the sensing circuit of FIG. 5.

FIG. 6 schematically shows the variable reference current generator G in the particular case of a sensing circuit for four-level memory cells MC ($m=2^n$ with n=2 and m=4). The reference current generator G comprises three distinct current generators IR0, IR1, and Ioff. Ioff is an offset current generator, generating a constant current, and is permanently connected to the non-inverting input of the current comparator 1. IR0 and IR1 are instead connectable to the non-inverting input of the current comparator 1 by means of respective switches SW0 and SW1, activated by respective control signals Q0 and Q1 of the group CNT.

The value of Ioff is equal to the reference current I0 shown in FIG. 2, i.e., it is equal to (IC1+IC0)/2, here IC1/2, because in the case IC0, the minimum memory cell current, is zero. The values of IR0 and IR1 are respectively equal to IC1 and IC2, i.e., to the currents sunk by a memory cell MC in two particular programming states.

In practice, the current generators IR0 and IR1 are implemented by means of two reference memory cells, identical to the memory cell MC to be read, programmed in two of the four possible programming states of the memory cells MC, more precisely in the states corresponding to the memory cell current values IC1 and IC2, respectively.

With these choices for the values of loft, IR0 and IR1, the variable reference current IR can take the following values:

SW0 and SW1 open: IR=Ioff=(½)*IC1=I0;

SW0 closed, SW1 open: IR=Ioff+IR0=(3/2)*IC1=I1;

SW0 open, SW1 dosed: IR=Ioff+IR1=IC2+(½)*IC1=I2.

These values are central with respect to the memory cell current values IC0–IC3, and are obtained by an additive process, adding a constant offset to the values IC1 and IC2. The reference current values can be adjusted by simply varying the value of the offset current generator Ioff.

Thanks to this, the current comparator 1 can be balanced (i.e., the currents to be compared are supplied to the inputs of the comparator in a 1:1 ratio). A balanced comparator is better than an unbalanced one from the point of view of the circuit and layout symmetry. Furthermore, a balanced comparator has a better common-mode rejection ratio, a better controlled switching characteristic, and lower mismatch errors.

The characteristics of the current comparator 1 depend on the number of programming levels to be discriminated. In particular, the input sensitivity (i.e., the minimum current difference which can be detected by the comparator) must be lower than the difference between the currents of two adjacent programming states, taking into account the spreading &values due to process tolerances.

Figures 8, 9:
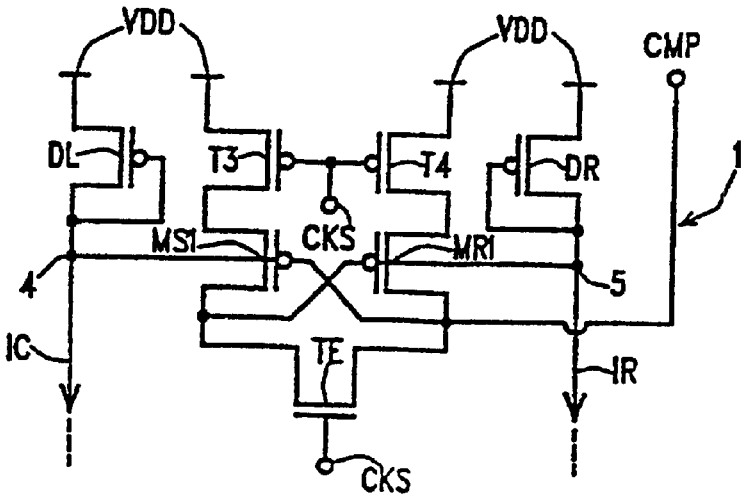
FIG. 8 is a circuit diagram of a current comparator of the sensing circuit of FIG. 5.
FIG. 9 is a truth table of the SAR of FIG. 7.

A suitable current comparator structure is shown in FIG. 8. The circuit comprises two load MOSFETs DL and DR (P-channel type) performing a current/voltage conversion of the memory cell current IC and of the reference current IR, respectively. The drain voltages 4 and 5 of MOSFETs DL and DR control the gates of two cross-connected MOSFETs MS1 and MR1 (P-channel type) forming a latch. The source electrodes of MS1 and MR1 can be connected to a power supply line VDD through two respective P-channel MOSFETs T3 and T4 which are commonly driven by a signal CKS derived from the clock signal CK (CKS can for example be the logic complement of CK). The drain electrodes of MS1 and MR1 can be short-circuited to each other by the activation of an N-channel MOSFET TE driven by the signal CKS. The drain electrode of MR1 forms the comparator output CMP. Experimental tests have shown that this circuit is quite fast even if a power supply VDD of 3 V is used, and has an input sensitivity of about 10 uA. These characteristics make the shown comparator structure particularly suitable for the sensing of four-levels memory cells.

The SAR 2 comprises a sequential network (or state-machine) implementing the successive approximation search algorithm. The state of the sequential network at a given step of the successive approximation search depends on its state at the present step, and on the result of the comparison between the cell current IC and the reference current IR at the preceding step. The sequential network activates in the correct sequence the switches SW0, SW1, depending on the results of the comparisons.

Figure 7:
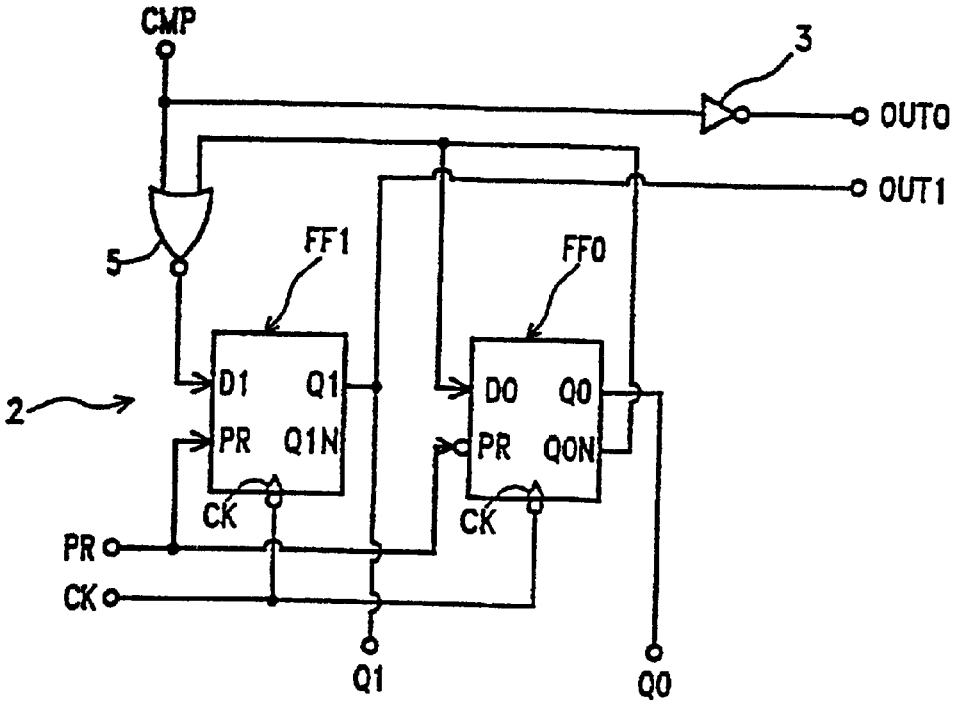
FIG. 7 is a circuit diagram of a Successive Approximation Register (SAR) of the circuit of FIG. 5, suitable for sensing four-level memory cells.

FIG. 7 is a circuit diagram of the sequential network of the SAR 2 in the case of a sensing circuit for four-level memory cells. The sequential network comprises two Delay-type ("D-type") flip-flops FF0, FF1. Each flip-flop FF0, FF1 has a clock input CK and a preset input PR; the clock inputs CK and the preset inputs PR of the flip-flops FF0, FF1 are commonly connected to the clock signal CK and to the preset signal PR, respectively; more precisely, FFO receives the logical complement of PR (as indicated by the inverting dot at the input PR of FFO). Each flip-flop has a data input D0, D1, a "true" data output Q0, Q1, and a "complemented" data output Q0N, Q1N which is the logic complement of Q0, Q1; as known to anyone skilled in the art, in a D-type flip-flop the true data output after a clock pulse takes the logic value of the data input during said clock pulse. The data input DO of the first flip-flop FF0 is supplied with the complemented data output Q0N of the first flip-flop FF0. The data input D1 of the second flip-flop FF1 is supplied with an output of a NOR gate 5 whose inputs are represented by the signal CMP and by the complemented data output Q0N of the first flip-flop FF0.

The true data outputs Q0, Q1 of the flip-flops FF0, FF1 form the group of digital control signals CNT for the variable reference current generator G in FIG. 6. The switches SW0, SW1 close when the respective control signal Q0, Q1 is a logic "1", otherwise the switches SW0, SW1 are open.

The signal CMP, complemented by an inverter 3, forms a least significant bit OUT0 of a two-bits output code OUT0, OUT1; the true data output Q1 of flip-flop FF1 forms a most significant bit OUT1 of the two-bits output code OUT0, OUT1. OUT0 and OUT1 represent the group of signals OUT shown in FIG. 5.

The preset signal PR is used at the circuit power-up to assure that the starting condition of the flip-flops FF0, FF1 is that corresponding to Q0=1 and Q1=0. This condition corresponds to the switch SW0 being closed, i.e., to a reference current value:

$$IR=Ioff+IR0=Ioff+IC1=(3/2)*IC1=I1$$

which is the central value between IC0 and IC3.

Figure 10:
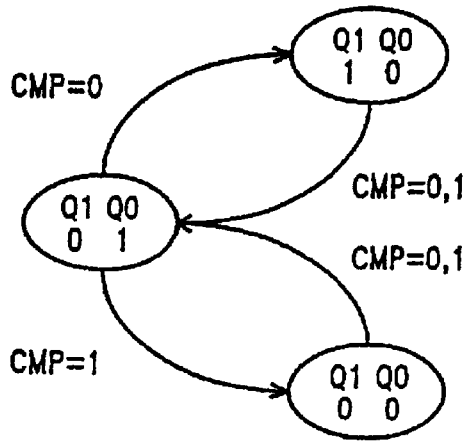
FIG. 10 is a state-transition diagram of the SAR of FIG. 7.
Figure 11:
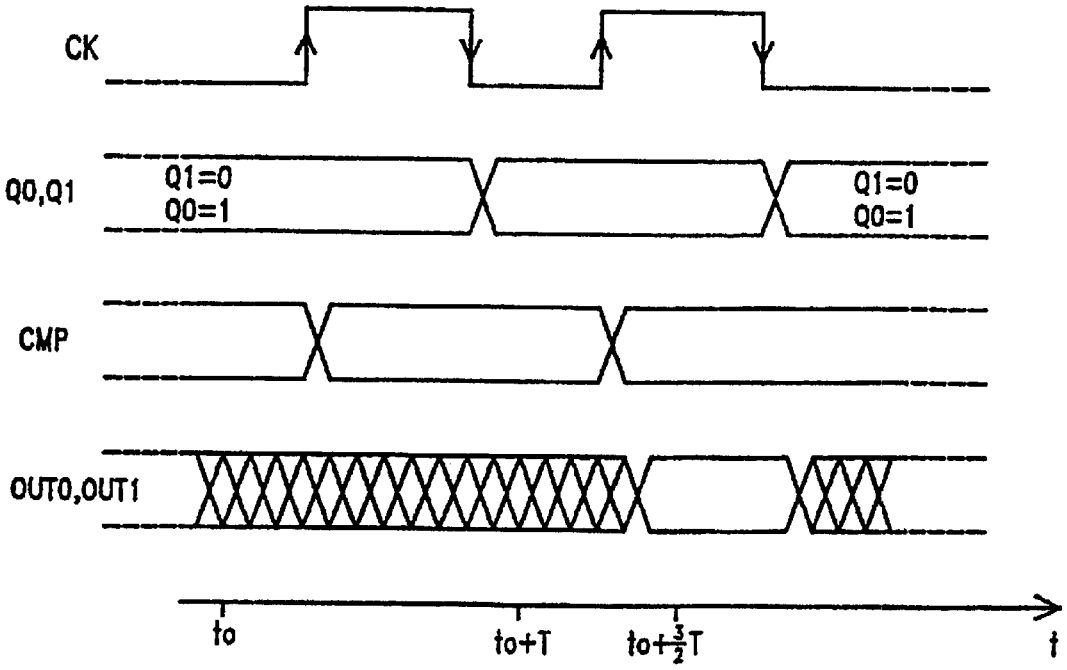
FIG. 11 is a time diagram of some signals of the SAR of FIG. 5.

The operation of the sensing circuit will be now described with reference to the truth-table of FIG. 9, to the state-transition diagram of FIG. 10 and to the time diagram of FIG. 11. As previously described in connection with FIGS. 2 to 4, the sensing of a two-levels memory cell MC is carded out in two steps. At the beginning of the first step ($t_0$ in FIG. 11) Q0=1 and Q1=0, SW0 is closed and SW1 is open, so that IR=I1; on the rising edge of the clock signal CK the comparator 1 compares the cell current IC with the reference current IR=I1: if IC is higher than IR, CMP=0, while if IC is lower than IR, CMP=1. On the falling edge of the clock signal CK, the logic state of Q0, Q1 changes to Q0=0 and Q1=1 if CMP=0, or to Q0=Q1=0 if CMP=1 (see FIGS. 9 and 10): in the first case, SW0 opens and SW1 closes, so that:

$$IR=Ioff+IR1=(1/2)*IC1+IC2=I2$$

which is the central value between IC2 and IC3, while in the second case both SW0 and SW1 opens, so that:

$$IR=Ioff=(½)*IC1=I0$$

which is the central value between IC1 and IC0.

On the next rising edge of the clock signal CK, IC is compared to the new value of IR: if IC is higher than IR, CMP=0, while if IC is lower than IR CMP=1. On the basis of the logic state of CMP and Q1, it is possible to determine the programming state of the memory cell MC; the valid output data OUT0, OUT1 are available at $t_0+(3/2)T$ (where T is the period of the clock signal CK), i.e., before the end of the second clock pulse. On the next falling edge of the clock signal CK, the flip-flops FF0, FF1 are automatically preset to the state Q0=1, Q1=0 (self-preset), and the circuit is ready to perform a new sensing.

The SAR 2 of the sensing circuit of the present invention is much simpler than that described in the already-cited European Patent Application No. 95830023.8: since in the variable reference current generator G one of the three current generators (Ioff) is permanently connected to the current comparator, only two control signals Q0 and Q1 (in the case of a four-level memory cell) are necessary to control the reference current generator G (in general, for an m-level memory cell, m−2 control signals are necessary). Furthermore, in the case of four-level memory cells, the output digital code OUT is obtained directly from the sequential network that implements the dichotomic search algorithm, no combinatorial network being necessary.

The previous description has been made taking as an example the case of a sensing circuit for four-level memory cells. Extending the case of a four-level memory cell to that of an m-level memory cell, the variable reference current generator G should comprise an offset current generator Ioff with value equal to (IC0+IC1)/2 (IC0 and IC1 being the two lowest currents of an m-level memory cell), and m−2 distinct current generators with values equal to IC1, IC2, . . . , ICm−2.

From the foregoing it will be appreciated that, although specific embodiments of the invention have been described herein for purposes of illustration, various modifications may be made without deviating from the spirit and scope of the invention. Accordingly, the invention is not limited except as by the appended claims.

We claim:

1. A sense circuit for reading a memory cell that can store one of a number of data levels, said number greater than two, and that can provide on an output terminal one of a number of signal levels that each identify a corresponding one of said data levels, said one signal level on said output terminal identifying said stored data level, said circuit comprising:

a comparator having a first input terminal coupled to said output terminal of said memory cell, a second input terminal, and an output terminal;

a successive approximation register having an input terminal coupled to said output terminal of said comparator, an output terminal that provides said stored data level, and a control output terminal; and a reference-signal generator having a control input terminal that is coupled to said control output terminal of said successive approximation register, an output terminal that is coupled to said second input terminal of said comparator, an offset-reference generator that generates an offset-reference value, a number of reference generators that each generate a reference value substantially equal to one of said signal levels, and a switch circuit that is coupled to said control input terminal, said switch circuit operable to provide said offset-reference value on said output terminal of said reference-signal generator when said successive approximation register selects none of said reference values, and operable to provide on said output terminal of said reference-signal generator a sum of said offset-reference value and one of said reference values selected by said successive approximation register.

2. The sense circuit of claim 1 wherein:

said signal levels include a first signal level that is the lowest of all of said signal levels, a second signal level that is higher than said first signal level and lower than all of the other signal levels, and a third signal level that is the highest of all of said signal levels;

said offset-reference value is between said first and second signal levels; and none of said reference generators generate reference values equal to said first signal level and said third signal level respectively.

3. The sense circuit of claim 2 wherein said first signal level has a value equal to zero.

4. The sense circuit of claim 1 wherein said signal levels, offset-reference value, and reference values are signal voltage levels, an offset-reference voltage value, and reference voltage values, respectively.

5. The sense circuit of claim 1 wherein said signal levels, offset-reference value, and reference values are signal current levels, an offset-reference current value, and reference current values, respectively.

6. The sense circuit of claim 1 wherein:

said signal levels, offset-reference value, and reference values are signal current levels, an offset-reference current value, and reference current values, respectively; and said reference generators each include a nonvolatile memory cell that is programmed to provide an associated one of said reference current values.

7. The sense circuit of claim 1 wherein said successive approximation register selects at most one of said reference values for said reference-signal generator to sum with said offset-reference value.

8. A method for reading a memory cell, comprising:

storing in said memory cell one of a plurality of data levels, said plurality greater than two;

associating each of said data levels with a different one of a plurality of signal levels;

providing on an output terminal of said memory cell the one of said signal levels that is associated with said stored data level;

generating an offset-reference value;

generating a plurality of reference values that are each approximately equal to one of said signal levels;

summing said offset-reference value with a first value of a group of values including said reference values and zero to generate a sum;

comparing said signal level on said output terminal with said sum;

adding said offset-reference value to a second value of said group of values to update said sum, said second value being within a range of said group of values, said range including the one of said group of values that is approximately equal to said signal level; and repeating said comparing and adding until said signal level is identified.

9. The method of claim 8, further comprising generating a digital value that corresponds to said stored data level.

10. The method of claim 8 wherein:

said associating includes associating each of said data levels with a different one of a plurality of current levels;

said generating an offset-reference value includes generating an offset-reference current; and said generating a plurality of reference values includes generating a plurality of reference currents that are each approximately equal to one of said current levels.

11. The method of claim 8 wherein:

said signal levels include a first signal level that is the least of all of said signal levels, a second signal level that is greater than said first signal level and less than all of the remaining signal levels, and a third signal level that is the greatest of all of said signal levels;

said generating an offset-reference value includes generating said offset-reference value between said first and second signal levels; and said generating a plurality of reference values includes generating said reference values each equal to a different one of said signal levels except said first and third signal levels.

12. The method of claim 8 wherein said summing and said adding respectively included summing with and adding to said offset-reference value no more than one of said reference values at a time.

13. A sense circuit for reading a first memory cell that can store one of a first number of data levels, said first number greater than two, and that can provide on an output terminal one of said first number of current levels that each identify a corresponding one of said data levels, said one current level on said output terminal identifying said stored data level, said circuit comprising:

a comparator having a first input terminal coupled to said output terminal of said memory cell, a second input terminal, and an output terminal;

a successive approximation register having an input terminal coupled to said output terminal of said comparator, an output terminal that provides said stored data level, and a control output terminal; and a switch circuit having a control input terminal that is coupled to said control output terminal, an output terminal that is coupled to said second input terminal of said comparator, and at least one switch having a control terminal coupled to said control input terminal, a first path terminal coupled to said output terminal of said switch circuit, and a second path terminal;

an offset-reference-current generator having an output terminal coupled to said output terminal of said switch circuit; and at least one reference-current generator that generates a reference current that is substantially equal to one of said current levels and that has an output terminal coupled to said second path terminal of said at least one switch.

14. A sense circuit for serial dichotomic sensing of multiple-level memory cells which can take one programming level among a plurality of $m=2^n$ ($n>=2$) different programming levels, comprising biasing means for biasing a memory cell to be sensed in a predetermined condition, so that the memory cell generates a cell current with a value belonging to a plurality of m distinct cell current values, each cell current value corresponding to one of said programming levels, a current comparator for comparing the cell current with a reference current generated by a variable reference current generator, and a successive approximation register supplied with an output signal of the current comparator and controlling the variable reference current generator, characterized in that the variable reference current generator comprises an offset current generator permanently coupled to the current comparator, and m−2 distinct current generators, independently activatable by the successive approximation register, each one generating a current equal to a respective one of said plurality of cell current values.

15. A sense circuit according to claim 14, characterized in that said offset current generator generates an offset current intermediate between the lowest cell current value of said plurality of cell current values and the second lowest cell current value that is higher than said lowest cell current value and is lower than all of the other cell current values, and each one of said m−2 distinct current generators generates a current equal to one of said cell current values except said lowest cell current value and the highest cell current value of said plurality of cell current values.

16. A sense circuit according to claim 15, characterized in that each of said m−2 current generators comprises a reference non-volatile memory cell programmed in one of said m programming levels, except the programming levels corresponding to said lowest and highest cell current values.

17. A sense circuit according to claim 15, characterized in that the successive approximation register comprises a sequential network which, starting from a predetermined initial state causing the variable reference current generator to generate a reference current with a value comprised between said lowest and highest cell current values dichotomizing the plurality of cell current values, evolves through a succession of states, each one determined by the preceding state and by the output signal of the current comparator, each state of the sequential network causing the variable reference current generator to generate a respective reference current with value comprised between a minimum value and a maximum value of a sub-plurality of the plurality of cell current values to which the cell current belongs.

18. A sense circuit according to claim 17, characterized in that in each one of said states of the sequential network at most one of the m−2 distinct current generators is activated.

19. A sense circuit according to claim 18, characterized in that said sequential network automatically presets to said initial state after sensing of a memory cell has been completed.

20. A sense circuit according to claim 17 for sensing four-level non-volatile memory cells, the variable reference current generator comprising an offset current generator, a first activatable current generator and a second activatable current generator, characterized in that the sequential network comprises two delay-type flip-flops, a first flip-flop having a data output controlling the activation of the first activatable current generator and a data input connected to a complemented data output of the first flip-flop, a second flip-flop having a data output controlling the activation of the second activatable current generator and a data input connected to an output of a NOR gate which is supplied with said complemented data output of the first flip-flop and with the output signal of the current comparator.

21. A sense circuit according to claim 20, characterized in that said two flip-flops are supplied with a preset signal activated at the circuit power-up to preset the sequential network in said initial state.

22. The sense circuit of claim 1 wherein said reference-signal generator comprises two fewer reference generators than there are data levels.

23. The sense circuit of claim 13 wherein said at least one reference-current generator comprises a second memory cell that is similar in structure to said first memory cell and that is programmed to provide said reference current.

24. A sense circuit for reading a memory cell that can store one of a plurality of data levels, said plurality greater than two, and that can provide on an output terminal one of a plurality of signal levels that each identify a corresponding one of the data levels, said one signal level on said output terminal identifying said stored data level, said circuit comprising:

a comparator having a first input terminal coupled to said output terminal of said memory cell, a second input terminal, and a comparator output terminal;

a successive approximation register having an input terminal coupled to said comparator output terminal, a register output terminal that provides said stored data level, and a register control output terminal; and a reference-signal generator having a control input terminal that is coupled to said register control output terminal, an output terminal that is coupled to said second input terminal of said comparator, an offset-reference generator that generates an offset-reference value, a plurality of reference generators that each generate a reference value that substantially equals one of said signal levels, and a switch circuit that is coupled to said control input terminal of said reference-signal generator, said switch circuit operable to provide on said output terminal of said reference-signal generator a sum of said offset reference value and one of said reference values selected by said successive approximation register.

25. The sense circuit of claim 24 wherein said switch circuit is operable to provide said offset-reference value on said output terminal of said reference-signal generator when said successive approximation register selects none of said reference values.

26. A method for reading a memory cell, comprising:

storing in said memory cell one of a plurality of data values, said plurality greater than two;

associating each of said data values with a unique one of a plurality of signal levels;

providing on an output terminal of said memory cell the one of said signal levels that is associated with said stored data value;

generating an offset value;

generating a plurality of reference values that are each approximately equal to one of said signal levels;

summing said offset-reference value with a first one of said reference values to generate a sum;

comparing said signal level on said output terminal of said memory cell with said sum;

adding said offset value to a second one of said reference values, said second reference value being within a subgroup of said reference values that includes the reference value that is approximately equal to said signal level; and repeating said comparing and adding until said stored data level is determined.

27. The method of claim 26 wherein one of said reference values is approximately equal to zero.

28. The method of claim 26 wherein said first reference value is one of said reference values that is closest to a midrange level that equals the sum of the lowest one of said signal levels and the highest one of said signal levels divided by two.

*29. A sense circuit for reading a memory cell that can store one of a first number of data levels, said first number greater than two, and that can provide on an output terminal one of signal levels that each identify a corresponding one of said data levels, said one signal level on said output terminal identifying said stored data level, said circuit comprising:*

*a comparator having a first input terminal coupled to said output terminal of said memory cell, a second input terminal, and an output terminal;*

*a successive approximation register having an input terminal coupled to said output terminal of said comparator, an output terminal that provides said stored data level, and a control output terminal; and*

*a reference-signal generator having a control input terminal that is coupled to said control output terminal, an output terminal that is coupled to said second input terminal of said comparator, an offset-reference generator that generates an offset-reference value, the reference generator generating a reference value equal to one of said signal levels, and a switch circuit that is coupled to said control input terminal, said switch circuit operable to provide said offset-reference value on said output terminal of said reference-signal generator when said successive approximation register does not select said reference value, and operable to provide on said output terminal of said reference-signal generator a sum of said offset-reference value and said reference value that said successive approximation register selects.*

*30. The sense circuit according to claim 29 further including a second reference signal generator that generates a record reference value equal to a second one of the signal levels, and said switch circuit is operable to provide on said output terminal of said reference signal generator a sum of said offset reference value and said second reference value.*

*31. The sense circuit of claim 30 wherein said successive approximation register selects at most one of said reference values for said reference-signal generator to sum with said offset-reference value.*

*32. The sense circuit of claim 1 wherein:*

*said signal levels, offset-reference value, and reference values are signal current levels, an offset-reference current value, and reference current values, respectively; and*

*said reference generators each include a nonvolatile memory cell that is programmed to provide an associated one of said reference current values.*

*33. The sense circuit of claim 1 wherein said signal levels, offset-reference value, and reference values are signal current levels, an offset-reference current value, and reference current values, respectively.*

*34. A sense circuit for reading a memory cell that can store a plurality of different number of data levels, and that can provide on an output terminal a signal that corresponds to one of said data levels, said circuit comprising:*

*a comparator having a first input terminal coupled to said output terminal of said memory cell, a second input terminal, and an output terminal;*

*a successive approximation register having an input terminal coupled to said output terminal of said comparator, an output terminal that provides said stored data level, and a control output terminal;*

*a switch circuit having a control input terminal that is coupled to said control output terminal, an output terminal that is coupled to said second input terminal of said comparator, and at least one switch having a control terminal coupled to said control input terminal,*

*a first path terminal coupled to said output terminal of said switch circuit, and a second path terminal;*

*an offset-reference-current generator having an output terminal coupled to said output terminal of said switch terminal; and*

*at least one reference-current generator that generates a reference current that has an output terminal coupled to said second path terminal of said at least one switch.*

*35. A sense circuit for reading a memory cell that can store a plurality of data levels and that can provide on an output terminal a signal level that corresponds to one of said data levels, said circuit comprising:*

*a comparator having a first input terminal coupled to said output terminal of said memory cell, a second input terminal, and an output terminal;*

*a successive approximation register having an input terminal coupled to said output terminal of said comparator, an output terminal that provides a signal representative of the stored data level, and a control output terminal; and*

*a reference-signal generator having a control input terminal that is coupled to said control output terminal, an output terminal that is coupled to said second input terminal of said comparator, an offset-reference generator that generates an offset-reference value; and*

*a switch circuit that is coupled to said control input terminal, said switch circuit operable to provide a reference signal on said output terminal of said reference-signal generator.*

*36. The circuit according to claim 35 further including a plurality of second reference signal generators the number in the plurality being the same number as the number of data levels that the memory cell can store.*

*37. The circuit according to claim 35 further including a plurality of second reference signal generators, the number of the second reference generators being fewer than the number data level that the memory cell can store.*

*38. A circuit comprising:*

*a memory cell that can store a plurality of data levels;*

*a comparator having a first input terminal coupled to said memory cell, a second input terminal, and an output terminal;*

*a register having an input terminal coupled to said output terminal of said comparator, an output terminal that provides a signal representative of the stored level, and a control output terminal; and*

*a reference-signal generator having a control input terminal that is coupled to said control output terminal of said register, and an output terminal that is coupled to said second input terminal of said comparator;*

*a switch circuit that is coupled to said control input terminal, to provide a reference value on said second input terminal of the comparator.*

*39. The circuit according to claim 38 wherein said register is a successive approximation register.*

*40. A method for reading a memory cell, comprising:*

*storing in said memory cell one of a plurality of data levels;*

*providing on an input terminal of said memory cell a signal level that corresponds to said stored data level;*

*generating a first reference value;*

*generating a plurality of second reference values;*

*generating an offset-reference value with an offset reference generator;*

*summing the offset reference value with one of the plurality of second reference values to obtain the first reference value;*

*comparing said signal level on said output terminal with the reference value; and*

*outputting a data signal from a register based on the comparison between the signal level and the reference value.*

*41. The method according to claim 40 further including:*

*adding the offset reference value to another of the plurality of the second reference values that is closer to the signal level to update the sum;*

*repeating the comparing and adding step until the signal level is identified.*

* * * * *